United States Patent [19]

Hotta

[11] Patent Number: 5,341,337
[45] Date of Patent: Aug. 23, 1994

[54] SEMICONDUCTOR READ ONLY MEMORY WITH PARALLELED SELECTING TRANSISTORS FOR HIGHER SPEED

[75] Inventor: Yasuhiro Hotta, Nara, Japan

[73] Assignee: Sharp Kabushiki Kaisha, Osaka, Japan

[21] Appl. No.: 121,424

[22] Filed: Sep. 16, 1993

[30] Foreign Application Priority Data

Sep. 18, 1992 [JP] Japan .................................. 4-250147

[51] Int. Cl.$^5$ .............................................. G11C 7/00
[52] U.S. Cl. .......................... 365/204; 365/63; 365/72; 365/104; 365/230.03; 365/230.06
[58] Field of Search ............ 365/230.03, 185, 104, 365/63, 72, 230.06, 204

[56] References Cited

U.S. PATENT DOCUMENTS

| | | | |
|---|---|---|---|
| 4,281,397 | 7/1981 | Neal et al. . | |
| 5,023,681 | 6/1991 | Ha ................... | 365/230.03 |
| 5,050,125 | 9/1991 | Momodomi et al. . | |
| 5,117,389 | 5/1992 | Yiu ...................... | 365/104 |
| 5,202,848 | 4/1993 | Nakagawara ........ | 365/104 |
| 5,268,861 | 12/1993 | Hotta .................. | 365/104 |
| 5,295,092 | 3/1994 | Hotta .................. | 365/104 |

FOREIGN PATENT DOCUMENTS 0329141 8/1989 European Pat. Off. .
3-142877 6/1991 Japan .

Primary Examiner—Joseph E. Clawson, Jr.
Attorney, Agent, or Firm—Nixon & Vanderhye

[57] ABSTRACT

A semiconductor ROM includes a plurality of word lines disposed in parallel and has a plurality of units which each includes: a first main bit line and a second main bit line which cross the word lines; first, second, third, and fourth, sub-bit lines disposed substantially in parallel to the first and second main bit lines, and each of which has a first end and a second end; four memory cell columns, each including a plurality of memory cells connected in parallel between respective adjacent two of the sub-bit lines; and a plurality of bank selecting switches for selecting one of the four memory cell columns. First ends of the first sub-bit line and the third sub-bit line are connected to the first main bit line, and the second ends of the second sub-bit line and the fourth sub-bit line are connected to the second main bit line. First and second ones of the bank selecting switches are disposed in parallel between the first main bit line and the first sub-bit line, and third and fourth ones of the bank selecting switches are disposed in parallel between the second main bit line and the fourth sub-bit line. A fifth one of the bank selecting switches is disposed between the first main bit line and the third sub-bit line, and a sixth one of the bank selecting switches is disposed between the second main bit line and the second sub-bit line.

4 Claims, 6 Drawing Sheets

SEMICONDUCTOR READ ONLY MEMORY WITH PARALLELED SELECTING TRANSISTORS FOR HIGHER SPEED

BACKGROUND OF THE INVENTION

1. Field of the Invention

The present invention relates to a semiconductor read only memory, and more particularly to a semiconductor read only memory in which MOSFETs (metal-oxide-semiconductor field effect transistors) constituting memory cells are connected in parallel.

2. Description of the Related Art

FIG. 5 shows an equivalent circuit of a semiconductor read only memory (hereinafter, referred to as "ROM") which is conventionally and widely used. The ROM in FIG. 5 is a lateral ROM including a plurality of word lines 1, a plurality of bit lines 2 which cross the word lines 1 and memory cells 3 each constituted by a MOSFET. Each memory cell 3 is connected in parallel between two adjacent bit lines 2. It is known that each of the bit lines 2 is a diffusion bit line formed of a diffusion layer or a metal bit line formed of a metal.

Further, for example in Japanese Patent Application No. 3-77914 (corresponding to the related, commonly assigned U.S. application Ser. No. 07/845,257, filed Mar. 3, 1992, naming Y. Hotta as inventor entitled "Semiconductor Read Only Memory" and now U.S. Pat. No. 5,268,861), in order to dispose memory cells more densely, a hierarchical bit line system including main bit lines and sub-bit lines has been proposed for the ROM.

FIG. 6 shows a circuit diagram showing park of a ROM using the hierarchical bit line system. In the hierarchical bit line system, each of main bit lines such as $MB_1$ is disposed between two adjacent sub-bit lines, namely, an odd-numbered sub-bit line such as $SB_1$ and an even-numbered sub-bit line such as $SB_2$. Each of the memory cells $M_{ij}$ constituted by MOSFETs is connected between such two adjacent sub-bit lines. The two adjacent sub-bit lines function as a source and a drain, respectively, for each of the memory cells $M_{ij}$. Further, gates of the memory cells $M_{ij}$ are connected to a word line $WL_j$.

The main bit lines $MB_1$, $MB_2$, . . . , etc. are connected to sense amplifiers $SA_1$, $SA_3$, . . . , etc. or grounded via transistors $Q_2$, $Q_4$, . . . , etc. Here, the odd-numbered main bit lines are each connected to a sense amplifier, and the even-numbered main bit lines are each grounded. Ends of the odd-numbered sub-bit lines such as $SB_1$ on the side of the memory cells $M_{i1}$ (i.e., on the upper side in FIG. 6) are connected to bank selecting MOSFETs $BSO_m$, respectively. Two adjacent bank selecting MOSFETs, for example, $BSO_1$ and $BSO_2$ are also connected to the odd-numbered main bit line $MB_1$ disposed therebetween. Further, a gate of each of the odd-numbered bank selecting MOSFETs $BSO_1$, $BSO_3$, . . . , etc. is connected to a bank selecting line $BO_1$, and a gate of each of the even-numbered bank selecting MOSFETs $BSO_2$, $BSO_4$, . . . , etc. is connected to a bank selecting line $BO_2$.

Further, ends of the even-numbered sub-bit lines such as $SB_2$ on the side of the memory cells $M_{ij}$ (i.e., on the lower side in FIG. 6) are connected to bank selecting MOSFETs $BSE_m$, respectively. Two adjacent bank selecting MOSFETs, for example, $BSE_1$ and $BSE_2$ are also connected to the even-numbered main bit line $MB_2$ disposed therebetween. Further, a gate of each of the odd-numbered bank selecting MOSFETs $BSE_1$, $BSE_3$, . . . , etc. is connected to a bank selecting line $BE_1$, and a gate of each of the even-numbered bank selecting MOSFETs $BSE_2$, $BSE_4$, . . . , etc. is connected to a bank selecting line $BE_2$.

FIG. 7 shows a pattern on a surface of a semiconductor substrate in the case where diffusion bit lines are used as the sub-bit lines in the circuit shown in FIG. 6.

In the ROM with the hierarchical bit line system shown in FIG. 6, the wiring pitch of the main bit lines can be made double as compared with that of the conventional lateral ROM shown in FIG. 5 . Accordingly, the ROM with the hierarchical bit line system has an advantage of reducing the parasitic capacitance of bit lines.

Moreover, in the case where the diffusion bit lines are used in the ROM with the hierarchical bit line system shown in FIG. 6, the wiring resistance can be greatly reduced. Therefore, the resistance to a discharge current for reading out information from each memory cell can be uniform regardless of positions of the memory cells from which information is read out.

However, in the ROM shown in FIG. 6, since the bank selecting MOSFETs are connected to the memory cells in series, the discharge current for reading out information from each memory cell greatly depends on a driving current for the bank selecting MOSFET connected thereto. Accordingly, in order to realize a high-speed reading operation, the discharge current should be increased by enlarging areas where the bank selecting MOSFETs are provided. Such an enlargement increases the chip size.

In the ROM shown in FIG. 6, information is read out, for example, from a memory cell $M_{41}$ in the following manner. In this case, the bank selecting lines $BO_1$ and $BE_2$ are set to be High, the bank selecting lines $BO_2$ and $BE_1$ are set to be Low, and the word line $WL_1$ is set to be High. In addition, a control signal $VG_1$ for the transistor $Q_2$ connected to the main bit line $MB_2$ is set to be High, so that the main bit line $MB_2$ is grounded.

FIG. 4 schematically shows a discharge current flow for reading out information from the memory cell $M_{41}$. The discharge current flows through the main bit line $MB_3$, the bank selecting MOSFET $BSO_3$, the sub-bit line $SB_5$, the memory cell $M_{41}$, the sub-bit line $SB_4$, the bank selecting MOSFET $BSE_2$, and the main bit line $MB_2$, in this order. Due to such a current flow in the circuit, the discharge current greatly depends on the driving current for the two bank selecting MOSFETs $BSO_3$ and $BSE_2$ both connected to the memory cell $M_{41}$ in series. If the driving currents for the bank selecting MOSFETs $BSO_3$ and $BSE_2$ are increased, the discharge current can be increased. When areas where the bank selecting MOSFETs are provided are enlarged so as to increase the driving currents for the bank selecting MOSFETs, however, there arises a problem that the chip size is enlarged.

SUMMARY OF THE INVENTION

A semiconductor read only memory according to the present invention, including a plurality of word lines disposed in parallel, the semiconductor read only memory having a plurality of units, each of the plurality of units includes: a first main bit line and a second main bit line which cross the word lines, a first sub-bit line, a second sub-bit line, a third sub-bit line, and a fourth sub-bit line which are disposed substantially in parallel to the first and second main bit lines, each of the first, second, third and fourth sub-bit lines having a first end and a second end; four memory cell columns, each including a plurality of memory cells connected in parallel between respective adjacent two of the first, second, third and fourth sub-bit lines; and a plurality of bank selecting switches for selecting one of the four memory cell columns. In the semiconductor read only memory, the first ends of the first sub-bit line and the third sub-bit line are connected to the first main bit line, and the second ends of the second sub-bit line and the fourth sub-bit line are connected to the second main bit line. First and second ones of the bank selecting switches are disposed in parallel between the first main bit line and the first sub-bit line, and third and fourth ones of the bank selecting switches are disposed in parallel between the second main bit line and the fourth sub-bit line. A fifth one of the bank selecting switches is disposed between the first main bit line and the third sub-bit line, and a sixth one of the bank selecting switches is disposed between the second main bit line and the second sub-bit line.

In one embodiment of the invention, the plurality of memory cells and the plurality of bank selecting switches are MOSFETs.

In another embodiment of the invention, the first sub-bit line, the second sub-bit line, the third sub-bit line, and the fourth sub-bit line are each formed of a diffusion layer.

In still another embodiment of the invention, the first main bit line and the second main bit line are formed of metal.

Thus, the invention described herein makes possible the advantage of providing a semiconductor read only memory capable of reading out at a high speed while provided with memory cells densely disposed.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating an example with reference to the accompanying drawings.

Figure 1:
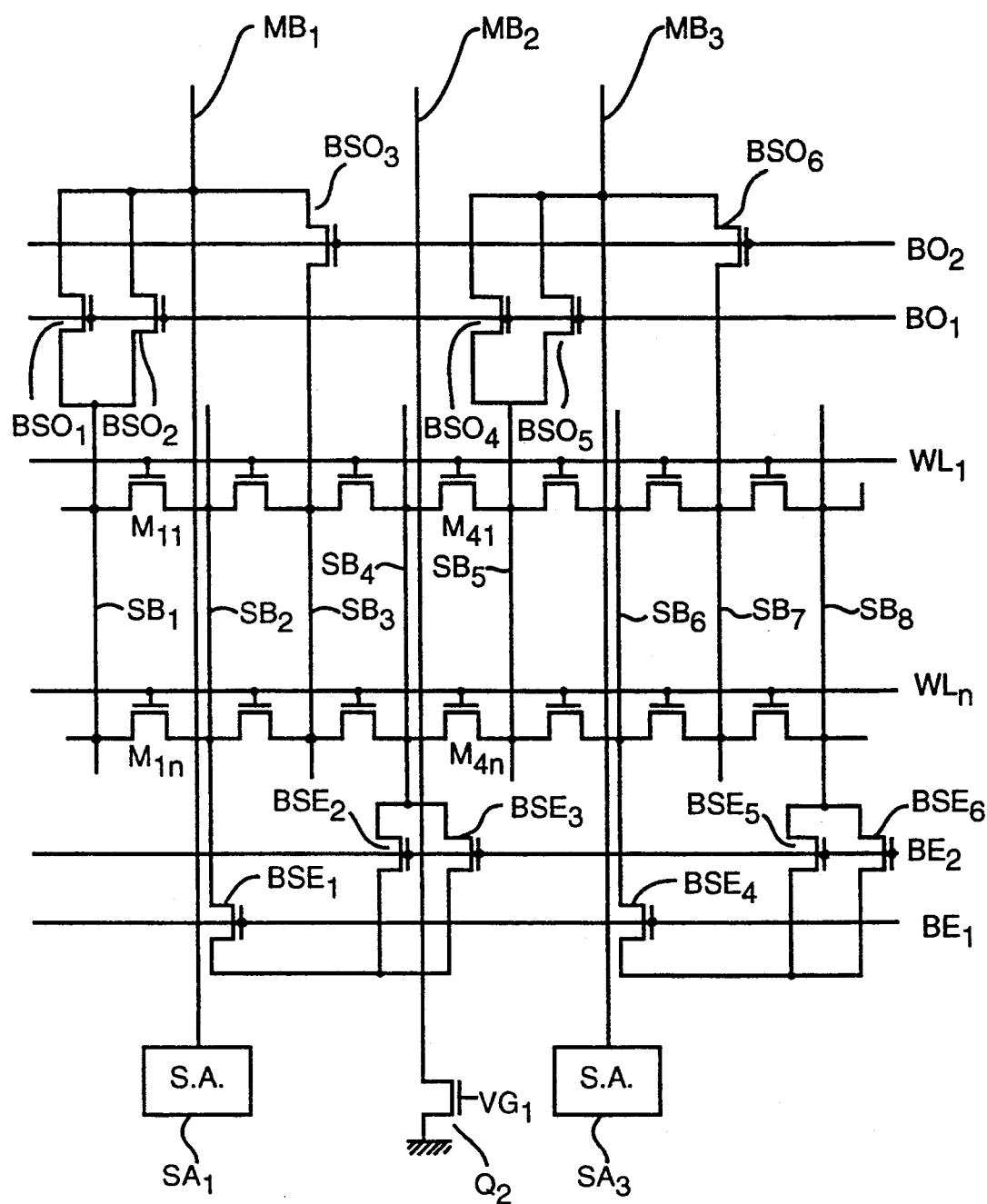
FIG. 1 is a circuit diagram showing part of a ROM in an example of the present invention.

FIG. 1 shows part of a circuit of a ROM in an example of the present invention. The ROM of the present example uses a hierarchical bit line system. The ROM in this present example has a memory cell region including a plurality of units, each unit having two main bit lines (for example, $MB_1$ and $MB_2$) and four sub-bit lines (for example, $SB_1$, $SB_2$, $SB_3$, and $SB_4$). Memory cells $M_{ij}$ constituted by MOSFETs are each connected in parallel between two adjacent sub-bit lines. Each of the sub-bit lines is formed of a diffusion layer which is formed on a semiconductor substrate. The MOSFETs each have part of the sub-bit lines connected thereto as a source and a drain. A gate of each of the memory cells $M_{ij}$ is connected to a word line $WL_j$. The main bit lines $MB_1$ and $MB_2$, ..., etc. are connected to sense amplifiers $SA_1$, $SA_3$, ..., etc. or grounded via transistors $Q_2$, $Q_4$, ..., etc. Herein, the odd-numbered main bit lines are each connected to a sense amplifier, and the even-numbered main bit lines are each grounded.

Hereinafter, the structure of the ROM will be described with reference to a unit including two main bit lines $MB_1$ and $MB_2$, four sub-bit lines $SB_1$, $SB_2$, $SB_3$, and $SB_4$, and four columns of memory cells $M_{1n}$, $M_{2n}$, $M_{3n}$, and $M_{4n}$. To one end of the sub-bit line $SB_1$ on the side of the memory cell $M_{11}$ (i.e., on the upper side in FIG. 1), two bank selecting MOSFETs $BSO_1$ and $BSO_2$ are connected in parallel. Gates of the bank selecting MOSFETs $BSO_1$ and $BSO_2$ are both connected to a bank selecting line $BO_1$. To one end of the sub-bit line $SB_3$ or, the side of the memory cell $M_{31}$, the bank selecting MOSFET $BSO_3$ is connected. A gate of the bank selecting MOSFET $BSO_3$ is connected to a bank selecting line $BO_2$. Further, these three adjacent bank selecting MOSFETs $BSO_1$, $BSO_2$, and $BSO_3$ are also connected to the main bit line $MB_1$.

To one end of the sub-bit line $SB_2$ on the side of the memory cell $M_{2n}$ (i.e., on the lower side in FIG. 1), the bank selecting MOSFET $BSE_1$ is connected. A gate of the bank selecting MOSFET $BSE_1$ is connected to a bank selecting line $BE_1$. To one end of the sub-bit line $SB_4$ on the side of the memory cell $M_{4n}$, the two bank selecting MOSFETs $BSE_2$ and $BSE_3$ are connected in parallel. Gates of the bank selecting MOSFETs $BSE_2$ and $BSE_3$ are both connected to a bank selecting line $BE_2$. Further, these three bank selecting MOSFETs $BSE_1$, $BSE_2$, and $BSE_3$ are also connected to the main bit line $MB_2$.

Figure 2:
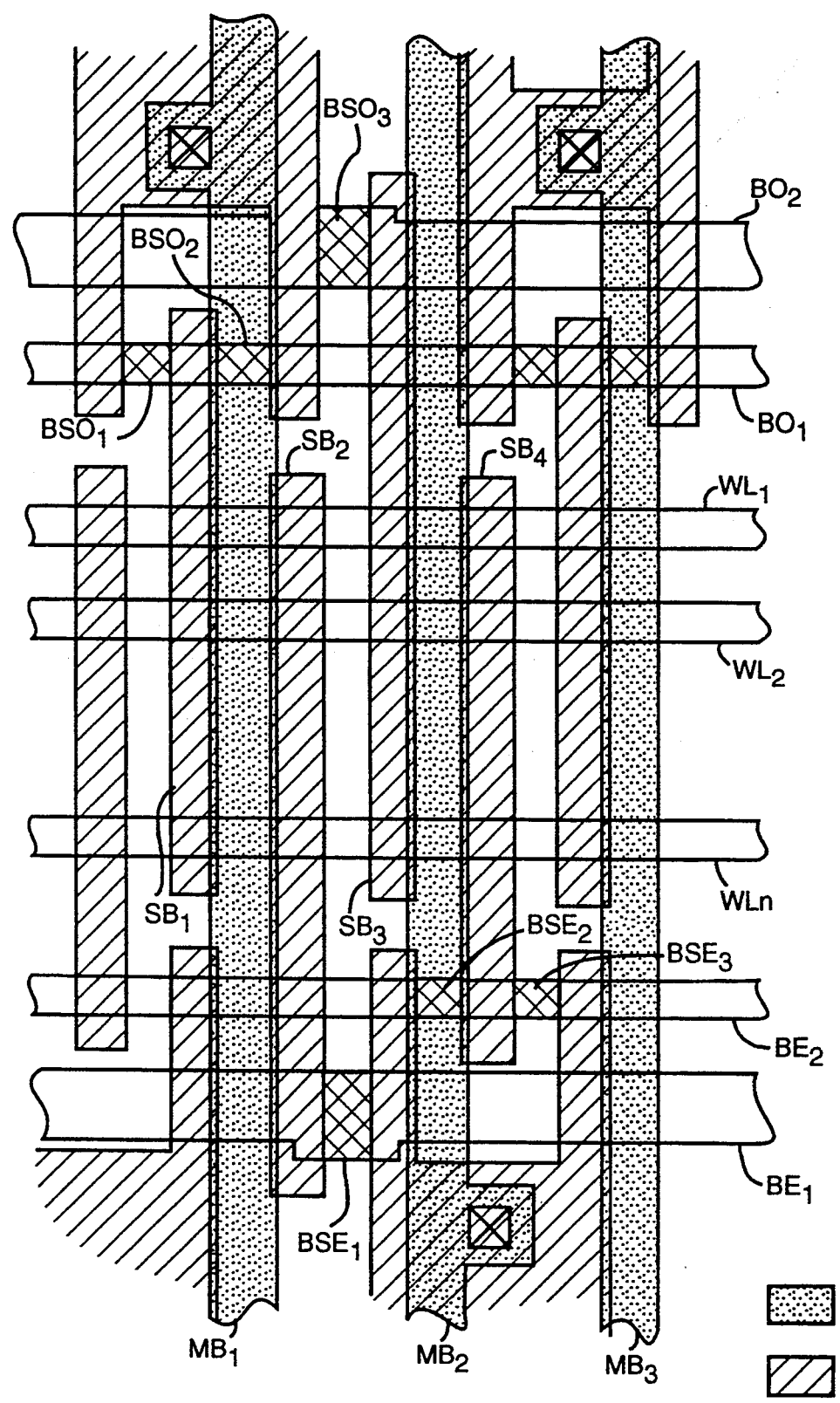
FIG. 2 shows a pattern on a surface of a semiconductor substrate in the case where diffusion bit lines are used as sub-bit lines in the ROM shown in FIG. 1.
Figure 7:
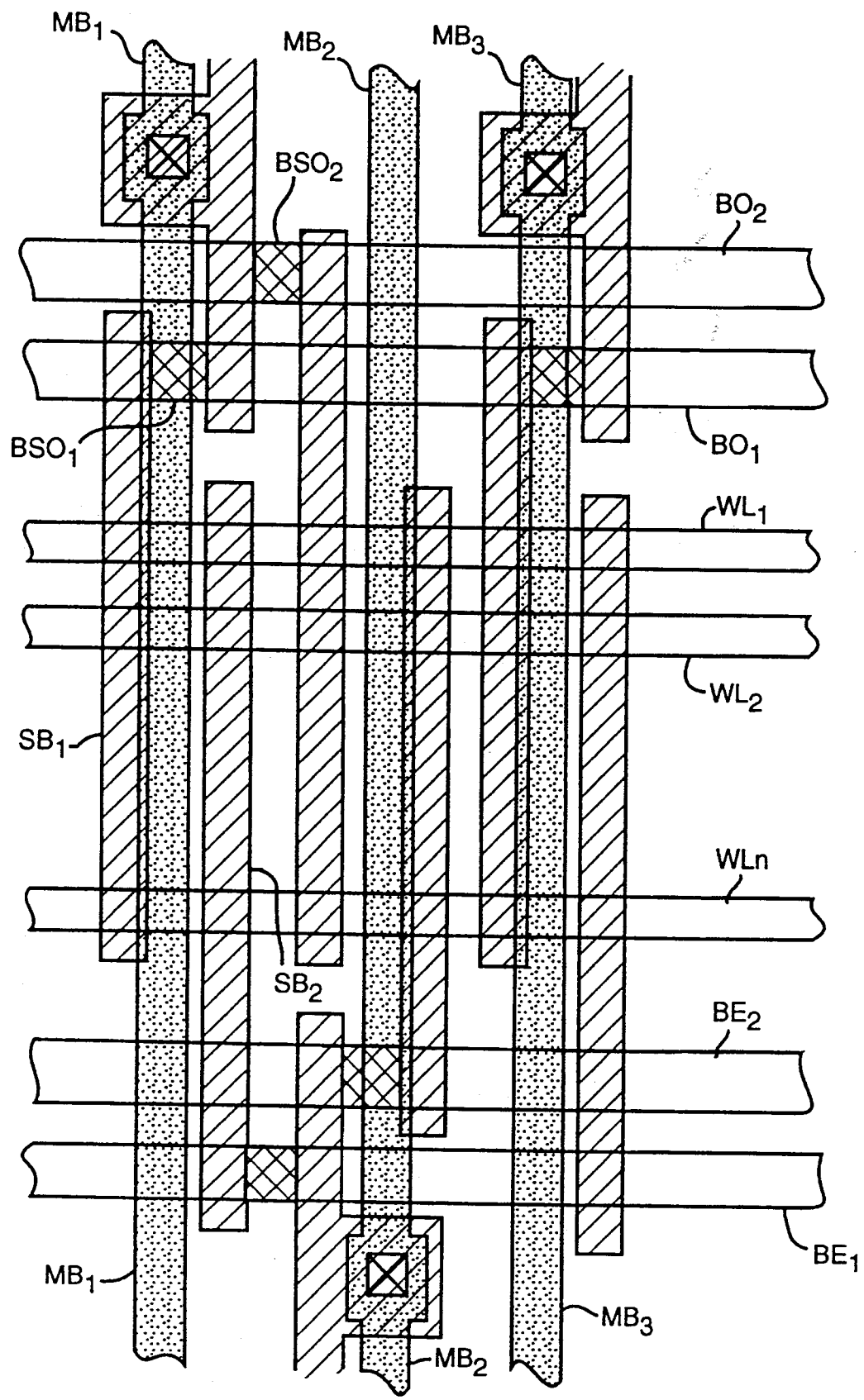
FIG. 7 shows a pattern on a surface of a semiconductor substrate in the case where diffusion bit lines are used as sub-bit lines in the conventional ROM shown in FIG. 6.

FIG. 2 shows an example of a layout pattern on a surface of a semiconductor substrate in the case where diffusion bit lines are used as the sub-bit lines in the circuit shown in FIG. 1. In the conventional ROM using diffusion bit lines as sub-bit lines as shown in FIG. 7, bank selecting lines $BO_1$, $BO_2$, $BE_1$, and $BE_2$ all have the same width. In this example, an interval between the bank selecting lines $BO_1$ and $BO_2$, and an interval between the bank selecting lines $BE_1$ and $BE_2$ are equal to those of the ROM shown in FIG. 7. However, the width of the bank selecting lines $BO_1$ and $BE_2$ is smaller and the width of the other bank selecting lines $BO_2$ and $BE_1$ is larger than those of the ROM shown in FIG. 7.

Further, in the conventional ROM as shown in FIG. 7, the bank selecting lines $BO_1$ and $BE_2$ are connected to the sub-bit lines via one bank selecting MOSFET, respectively, whereas in the ROM of this example, the bank selecting lines $BO_1$ and $BE_2$ having a smaller width than in FIG. 7 are connected to the sub-bit lines $SB_1$ and $SB_4$ via two bank selecting MOSFETs connected in parallel, respectively. Due to this structure, channel widths of the bank selecting MOSFETs $BSO_3$ and $BSE_1$ connected to the bank selecting lines $BO_2$ and $BE_1$ can be enlarged, without varying the chip size, and two bank selecting MOSFETs $BSO_1$ and $BSO_2$ connected to the bank selecting line $BO_1$ can be arranged in parallel, and MOSFETs $BSE_2$ and $BSE_3$ connected to the bank selecting lines $BE_2$ can be arranged in parallel.

In the ROM having the above-mentioned structure, information is read out from the memory cell $M_{11}$ in the following manner. The bank selecting lines $BO_1$ and $BE_1$ are set to be High, the bank selecting lines $BO_2$ and $BE_2$ are set to be Low, and the word line $WL_1$ is set to be High. Further, a control signal $VG_1$ for the transistor $Q_2$ connected to the main bit line $MB_2$ is set to be High, so that the main bit line $MB_2$ is grounded.

Figure 3:
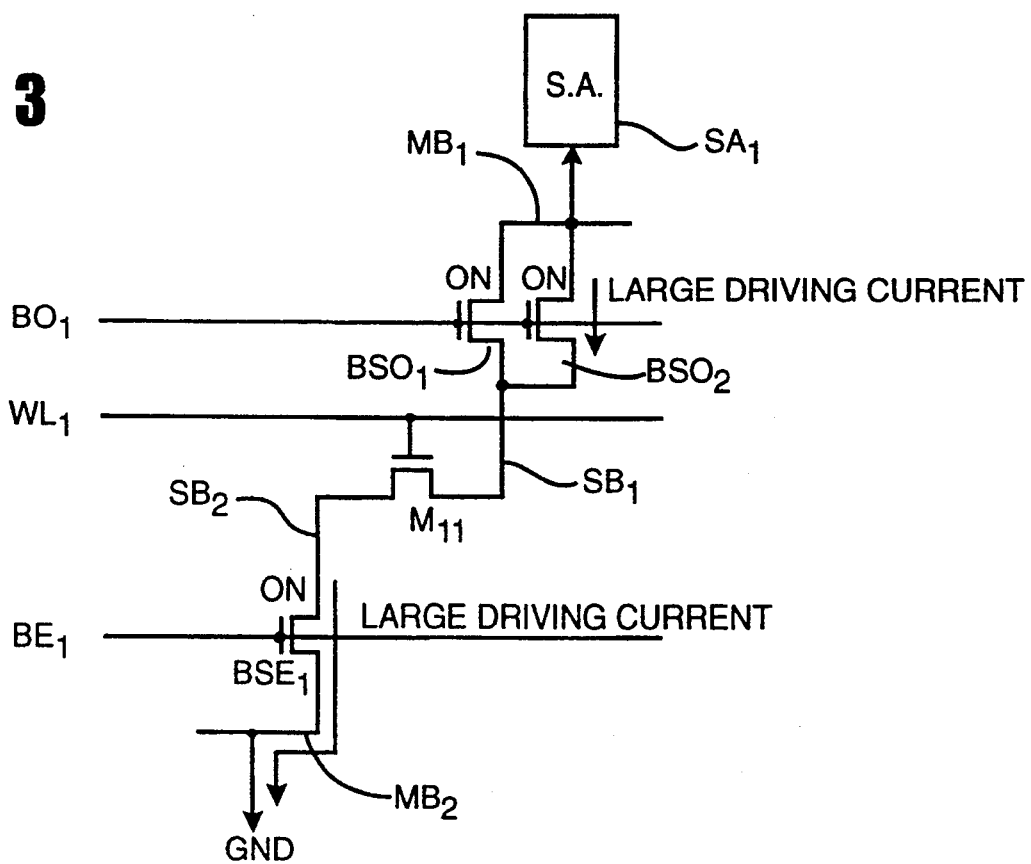
FIG. 3 is a circuit diagram schematically showing a discharge current flow when information is read out from a memory cell in the ROM shown in FIG. 1.
Figure 4:
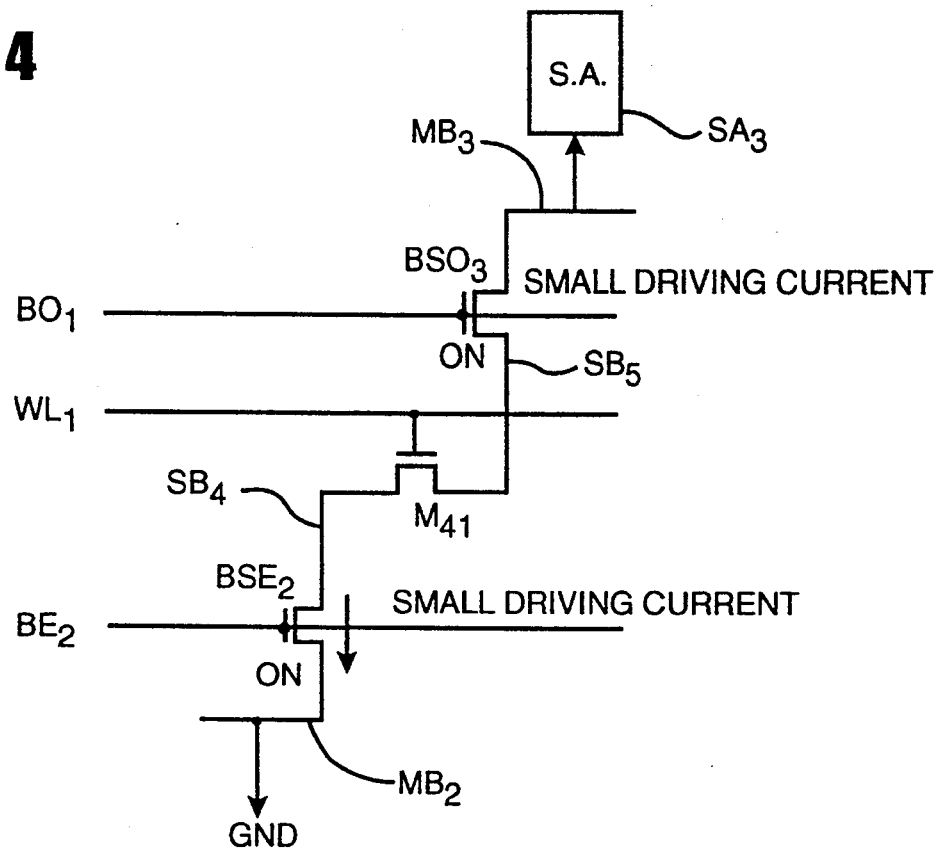
FIG. 4 is a circuit diagram schematically showing a discharge current flow when information is read out from a memory cell in a conventional ROM with a hierarchical bit line system.
Figure 5:
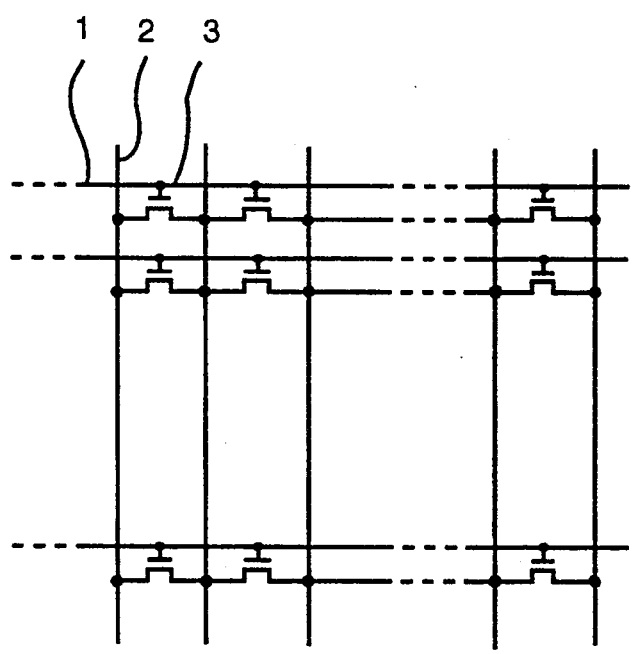
FIG. 5 is a circuit diagram of a conventional lateral ROM.

FIG. 3 schematically shows a discharge current flow for reading out information in the ROM shown in FIG. 3. As is shown in FIG. 3, a discharge current for reading information from the memory cell $M_{11}$ flows through the main bit line $MB_1$, the bank selecting MOSFETs $BSO_1$ and $BSO_2$, the sub-bit line $SB_1$, the memory cell $M_{11}$, the sub-bit line $SB_2$, the bank selecting MOSFET $BSE_1$, and the main bit line $MB_2$ in this order.

Figure 6:
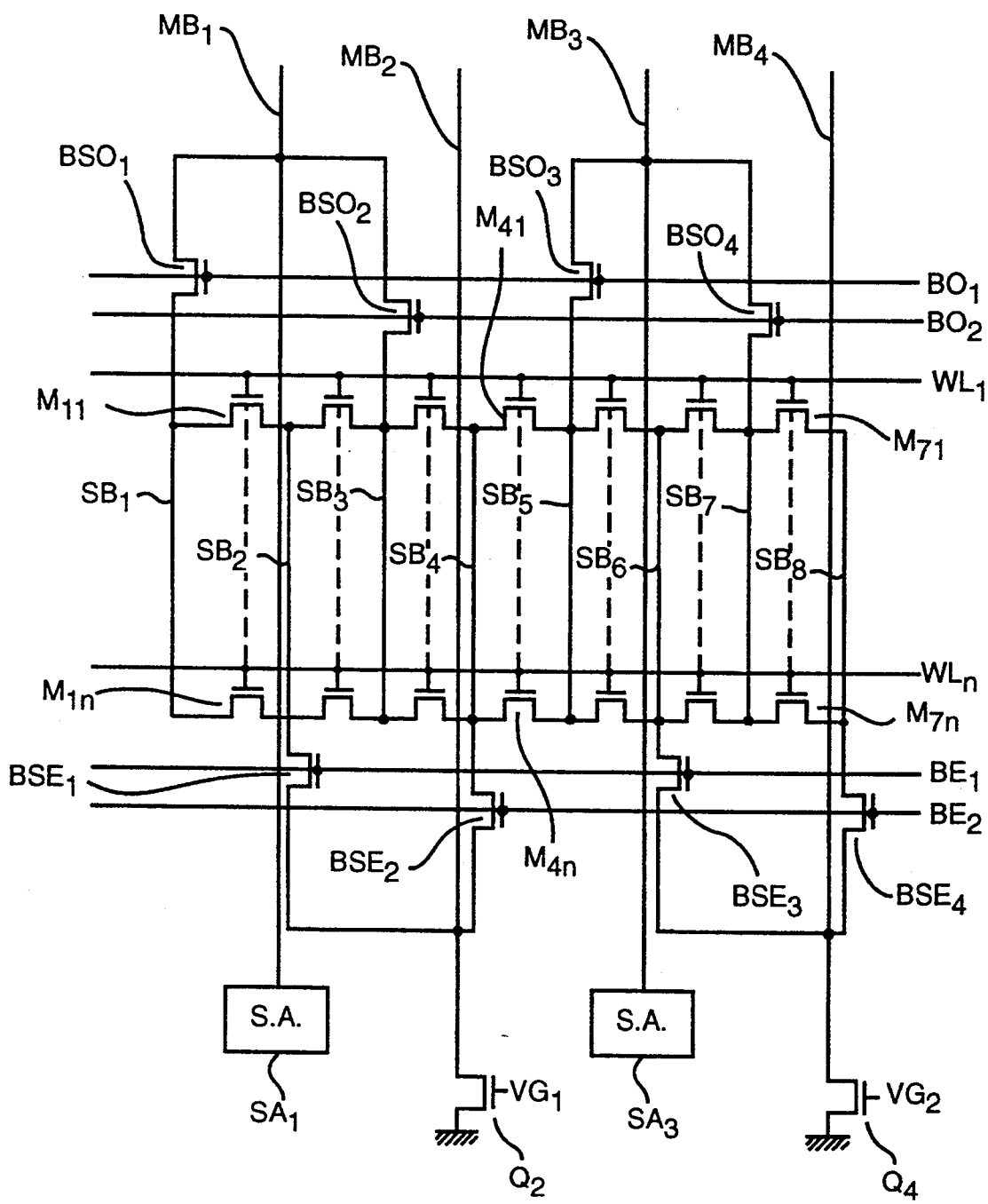
FIG. 6 is a circuit diagram showing part of a conventional ROM with a hierarchical bit line system.

In this circuit, to the bank selecting line $BO_1$, two bank selecting MOSFETs $BSO_1$ and $BSO_2$ are connected in parallel. To the bank selecting line $BE_1$, one MOSFET $BSE_1$ having a larger channel width than that in FIG. 6 is connected. Accordingly, the discharge current can be made larger than that in the conventional hierarchical system shown in FIG. 6. As a result, the discharge current can be increased without enlarging the chip size, so that the high-speed reading operation is realized.

In the above example, though a mask ROM has been described, the invention is applicable to any type of semiconductor read only memory such as an erasable programmable ROM (EPROM) or an electrically erasable programmable ROM ($E^2$PROM) in which a plurality of memory cells are disposed in a matrix array.

As is described above, according to the present invention, driving currents for bank selecting MOSFETs can be greatly increased without enlarging the chip size. Accordingly, a larger discharge current for reading information can be obtained. As a result, the reading operation can be performed at a higher speed, and a wide operation margin can be ensured, thereby guaranteeing a stable reading operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor read only memory including a plurality of word lines disposed in parallel, the semiconductor read only memory having a plurality of units, each of the plurality of units comprising:
   a first main bit line and a second main bit line which cross the word lines,
   a first sub-bit line, a second sub-bit line, a third sub-bit line, and a fourth sub-bit line which are disposed substantially in parallel to the first and second main bit lines, each of the first, second, third and fourth sub-bit lines having a first end and a second end;
   four memory cell columns, each including a plurality of memory cells connected in parallel between respective adjacent two of the first, second, third and fourth sub-bit lines; and
   a plurality of bank selecting switches for selecting one of the four memory cell columns;
   wherein to the first main bit line, the first ends of the first sub-bit line and the third sub-bit line are connected, and to the second main bit line, the second ends of the second sub-bit line and the fourth sub-bit line are connected,
   wherein first and second ones of the bank selecting switches are disposed in parallel between the first main bit line and the first sub-bit line, and third and fourth ones of the bank selecting switches are disposed in parallel between the second main bit line and the fourth sub-bit line, and
   wherein a fifth one of the bank selecting switches is disposed between the first main bit line and the third sub-bit line, and a sixth one of the bank selecting switches is disposed between the second main bit line and the second sub-bit line.

2. A semiconductor read only memory according to claim 1, wherein the plurality of memory cells and the plurality of bank selecting switches are MOSFETs.

3. A semiconductor read only memory according to claim 1, wherein the first sub-bit line, the second sub-bit line, the third sub-bit line, and the fourth sub-bit line are each formed of a diffusion layer.

4. A semiconductor read only memory cell according to claim 3, wherein the first main bit line and the second main bit line are formed of metal.

* * * * *